US006639480B2

(12) United States Patent
Kubo et al.

(10) Patent No.: US 6,639,480 B2
(45) Date of Patent: Oct. 28, 2003

(54) CRYSTAL OSCILLATOR

(75) Inventors: Kuichi Kubo, Saitama (JP); Fumio Asamura, Saitama (JP)

(73) Assignee: Nihon Dempa Kogyo Co. Ltd., Tokyo (JP)

( * ) Notice: Subject to any disclaimer, the term of this patent is extended or adjusted under 35 U.S.C. 154(b) by 0 days.

(21) Appl. No.: 10/210,405

(22) Filed: Aug. 1, 2002

(65) Prior Publication Data

US 2003/0025568 A1 Feb. 6, 2003

(30) Foreign Application Priority Data

Aug. 1, 2001 (JP) ....................................... 2001-233443

(51) Int. Cl.[7] .................................................. H03B 5/32
(52) U.S. Cl. ...................................................... 331/158
(58) Field of Search ............................ 331/158, 117 D, 331/108 C, 161, 187

(56) References Cited

U.S. PATENT DOCUMENTS 4,039,973 A * 8/1977 Yamashiro ............ 331/116 FE
4,864,255 A * 9/1989 Yoshida ....................... 331/75
5,151,666 A * 9/1992 Tamagawa ................... 331/64
5,187,453 A * 2/1993 Aoyagi et al. ......... 331/116 FE
6,046,648 A * 4/2000 Nakamiya et al. ..... 331/116 FE
6,104,257 A * 8/2000 Mann ......................... 331/158
6,118,348 A * 9/2000 Narahara .............. 331/116 FE
6,411,172 B2 * 6/2002 Tsukagoshi et al. ........ 331/158

* cited by examiner

*Primary Examiner*—My-Trang Nuton
(74) *Attorney, Agent, or Firm*—Katten Muchin Zavis Rosenman

(57) ABSTRACT

A quartz-crystal oscillator comprises an oscillating stage and a buffering stage. The oscillating stage has a resonance circuit including a quartz-crystal unit and a capacitor, and an inverting amplifier amplifying a resonance frequency component of the resonance circuit due to feedback oscillation. The buffering stage is provided for outputting the output of the oscillating stage by reducing the amplitude thereof, and has first and second MOS FETs of the same conductive type arranged in series between a power supply and a reference potential. A signal at the output terminal of the inverting amplifier is impressed to the gate of the first MOS FET, a signal at the input terminal of the inverting amplifier is impressed to the gate of the second MOS FET, and an output signal is obtained from a connecting point of the first and second MOS FETs.

7 Claims, 2 Drawing Sheets

CRYSTAL OSCILLATOR

BACKGROUND OF THE INVENTION

1. Field of the Invention

The present invention relates to a quartz-crystal oscillator using an inverting amplifier, and more particularly to a crystal oscillator in which an output level of a rectangular output signal is restricted.

2. Description of the Related Art

A quartz-crystal oscillator constituted by a quartz-crystal unit and an oscillating circuit employing the crystal unit has been widely used in a variety of electronic appliances as a reference source of frequency and time. There are many types of crystal oscillators. One of them is a crystal oscillator employing an inverting amplifier including a CMOS (Complementary Metal-Oxide-Semiconductor) circuit, and used, for example, as a reference signal source of a PLL (Phase-Locked Loop) circuit of a portable telephone.

FIG. 1 illustrates an example of a circuit constitution of a conventional crystal oscillator employing the CMOS inverting amplifiers. This crystal oscillator includes constituents roughly classified into two groups, i.e., oscillating stage 1 and buffering stage 2, which are integrated into an integrated circuit (IC) chip. The crystal oscillator is mounted on a printed wiring board and supplies an oscillating output to respective circuits, i.e., respective external circuits on this printed wiring board.

Oscillating stage 1 comprises a resonance circuit with crystal unit 3 made of, for example, a quartz-crystal blank of AT cut, and oscillating capacitors 4*a* and 4*b* disposed on opposite sides of crystal unit 3 and connected, respectively, to a reference potential. In the illustrated example, the reference potential corresponds to the ground potential. Inverting amplifier 6 for oscillation, which has feedback resistor 5, is provided for amplifying an oscillating signal of the resonance circuit. Input and output terminals of inverting amplifier 6 are connected to one and the other ends of crystal unit 3, respectively. Inverting amplifier 6 is connected to and driven by the electric power supply that is constituted by a first constant voltage source $V_{d1}$.

The oscillating frequency of the oscillating stage 1 depends on a resonance frequency of the resonance circuit, and is determined by an equivalent serial capacitance (a load capacitance) viewing from crystal unit 3.

The inverting amplifier employed in this circuit will be described with reference to FIG. 2.

The inverting amplifier is a so-called CMOS inverter circuit formed by P-channel MOS (P-MOS) FET (Field Effect Transistor) 21 and N-channel MOS (N-MOS) FET 22, which are in series connection. In this example, the drain of P-MOS FET 21 and the drain of N-MOS FET 22 are connected together, and the source of P-MOS FET 21 is connected to power supply $V_d$ while grounding the source of N-MOS FET 22. Further, the gates of respective MOS FETs 21 and 22 are connected at a common point to which input signal $V_{in}$ is impressed. Output signal $V_{out}$ is derived from the commonly connected drains. In the described inverting amplifier, with every high-level and low-level half waves of the frequency amplitude signal, which is impressed to the gates as input signal $V_{in}$, P-MOS FET 21 and N-MOS FET 22 perform amplifying operations to generate output signal $V_{out}$ of which the phase is reversed from that of input signal $V_{in}$.

At oscillating stage 1, due to the employment of the above-described inverting amplifier, the phases between the input and output signals differ from one another by approximately 180 degrees, so as to satisfy a condition for causing oscillation, so that as an oscillating output, a rectangular signal may be obtained. Usually, the amplitude level of this oscillating output is the same as that of power supply voltage $V_{d1}$.

Buffering stage 2 is constituted by inverting amplifier 7, which is identical with the above-described inverting amplifier 6 and is provided with feedback resistor 5A, and another inverting amplifier 8 connected to the output terminal of inverting amplifier 7. The output of inverting amplifier 8 corresponds to output $V_o$ of this crystal oscillator. The output of oscillating stage 1 is supplied to the input terminal of inverting amplifier 7, via capacitor 9 for blocking a direct current component. These inverting amplifiers 7 and 8 are connected to and driven by a power supply constituted by second constant voltage source $V_{d2}$. Voltage $V_{d2}$ of the second constant voltage source is set to be smaller than that $V_{d1}$ of the first constant voltage source.

Inverting amplifier 7 of buffering stage 2 is provided for restricting the amplitude of the oscillating output, that is, oscillating frequency signal, from oscillating stage 1 to a small value. The larger are the level or amplitude of the oscillating output at oscillating stage 1, the smaller is the noise, and from this viewpoint, the voltage of first constant voltage source $V_{d1}$ should preferably be made large. However, on the external circuit supplied with the oscillating signal from this crystal oscillator, if the level of the oscillating output is high, a current flowing through a load becomes large, and as a result, power consumption of those external circuit must become large. Therefore, it is preferred that the amplitude of the oscillating signal supplied to the external circuit is smaller. Thus, in this crystal oscillator, second constant voltage source $V_{d2}$ ($<V_{d1}$) is used for clipping the amplitude of the oscillating output so as to restrict it to a smaller value. Inverting amplifier 8 is provided for electrically shielding oscillating stage 1 from the external circuits, so that any unfavorable affect on oscillating stage 1 from the external circuits is made smaller.

Nevertheless, the above constituted crystal oscillator employing second constant voltage source $V_{d2}$ in buffering stage 2 must suffer from the fact that when it is formed in an IC chip, the chip area must necessarily increase while preventing the crystal oscillator from being downsized. Further, in buffering stage 2, although the oscillating output is clipped by second constant voltage source $V_{d2}$ due to feedback amplification done by inverter 7, such feedback amplification increases noise, and becomes a factor in worsening of the phase noise characteristic.

SUMMARY OF THE INVENTION

An object of the present invention is to provide a crystal oscillator, capable of promoting the downsizing thereof when it is formed in an IC chip and having a good phase noise characteristic.

The above object can be achieved by a crystal oscillator which comprises an oscillating stage which has a resonance circuit including a crystal unit and a capacitor, an inverting amplifier, and a feedback resistor connected to the inverting amplifier, the inverting amplifier feeding back and amplifying a resonance frequency component of the resonance circuit to output the resonance frequency component; and a buffering stage for outputting an output of the oscillating stage after reducing an amplitude thereof, the buffering stage including first and second MOS FETs of the same conductive type arranged in series between an electric power supply and a reference potential, wherein a signal at an output terminal of the inverting amplifier is impressed to a gate of said first MOS FET, a signal at an input terminal of the inverting amplifier is impressed to a gate of the second MOS FET, and an output is obtained from a connecting point of the first and second MOS FETs.

In the crystal oscillator according to the present invention, the first and second MOS FETs of the same conductive type are connected in series in a manner such that a pair of signals of reverse polarities from the oscillating stage are impressed to the gates of these MOS FETs, and an output is obtained from the connecting point of these MOS FETs. As a result, due to a threshold voltage between the gate and a source of the first MOS FET, the level of the output at the connecting point can be small. Therefore, the amplitude of the signal outputted from the buffering stage can be restricted to a small value while permitting the oscillating and buffering stages to be connected to a common power supply, and accordingly when the crystal oscillator is formed in an IC chip, the size thereof can be made small. Further, since the buffering stage does not employ any inverting amplifier having a feedback resistor, it is possible to remove a noise source, so that the phase noise characteristic can be improved.

DETAILED DESCRIPTION OF THE INVENTION

Figure 3:
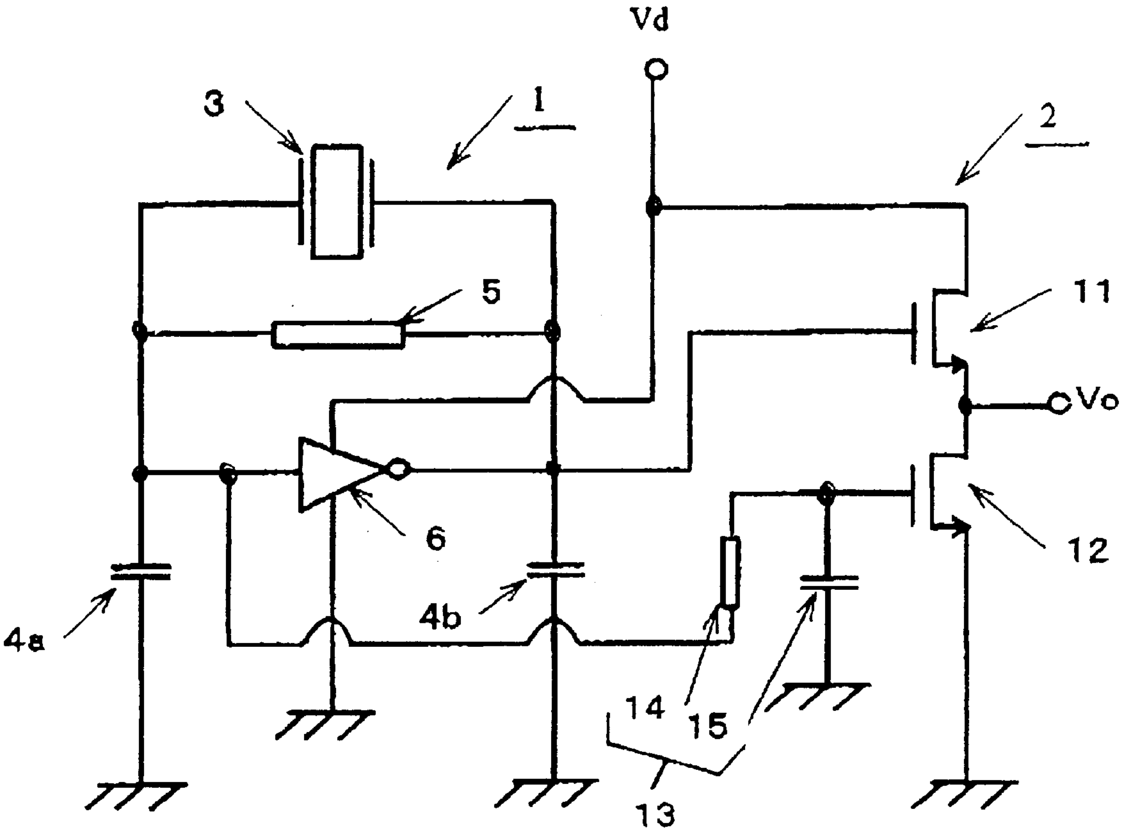
FIG. 3 is a circuit diagram illustrating one example of a crystal oscillator according to an embodiment of the present invention.

FIG. 3 shows a circuit arrangement of the crystal oscillator according to an embodiment of the present invention. Those parts shown in FIG. 3, which are identical to those shown in FIG. 1 are denoted by identical reference characters.

The quartz-crystal oscillator shown in FIG. 3 is constituted by oscillating stage 1 and buffering stage 2.

Figure 1:
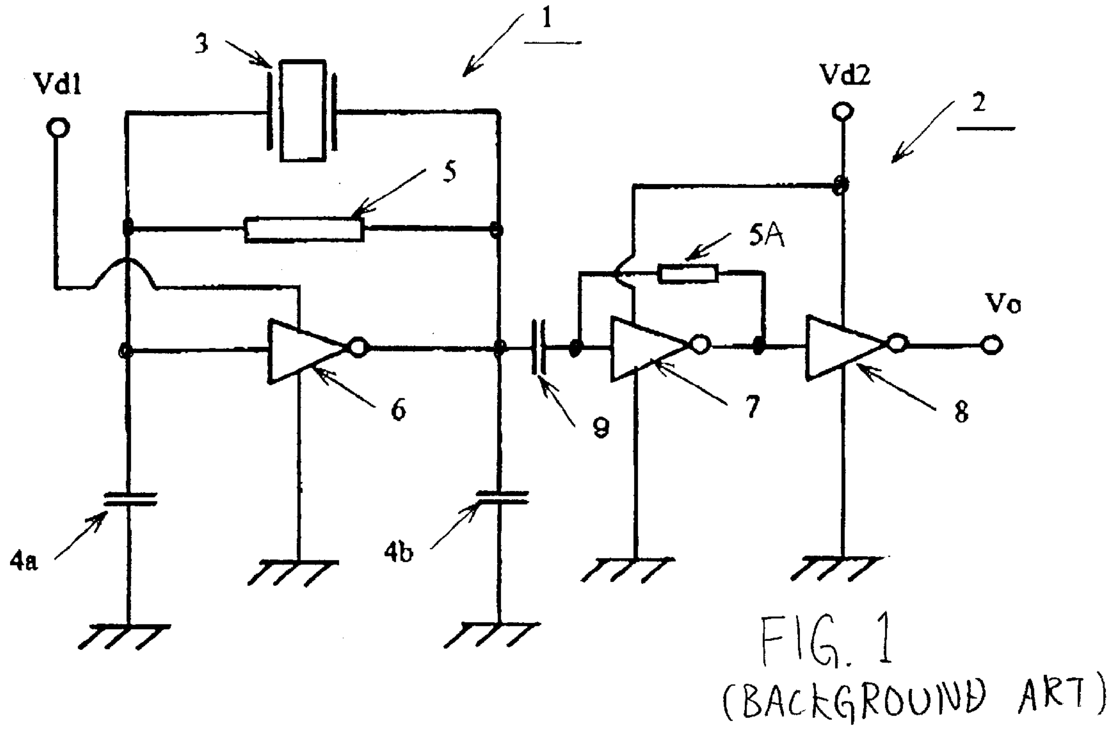
FIG. 1 is a circuit diagram illustrating the constitution of a conventional crystal oscillator.
Figure 2:
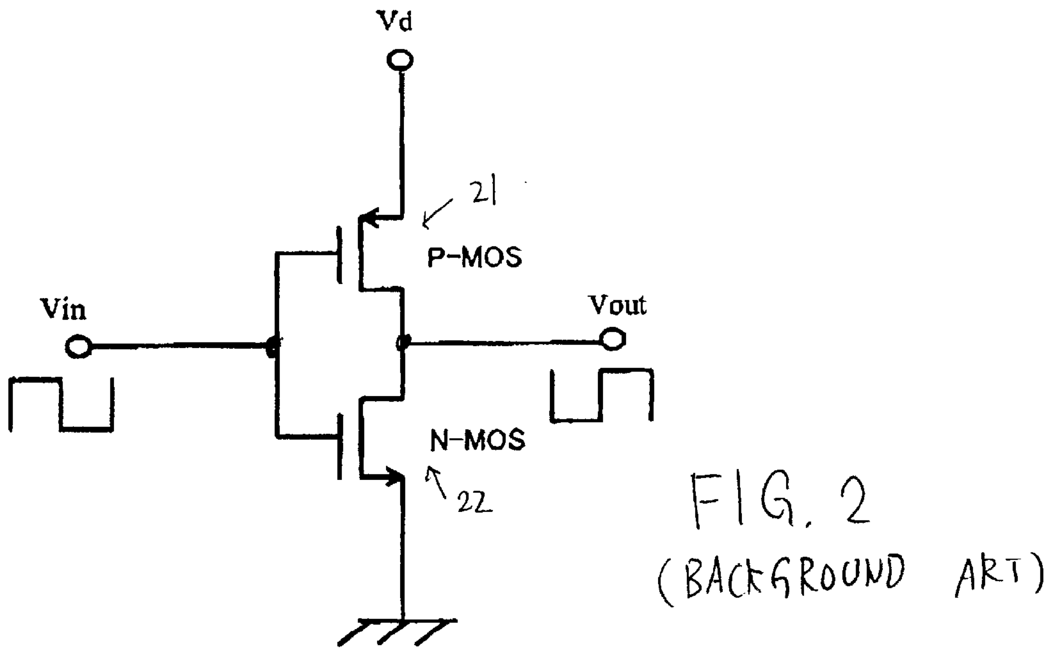
FIG. 2 is a circuit diagram illustrating the constitution of a CMOS inverting amplifier.

Oscillating stage 1, similar to the crystal oscillator of FIG. 1, is constituted by quartz-crystal unit 3, capacitors 4*a* and 4*b*, which form a resonance circuit with crystal unit 3, feedback resistor 5, and CMOS inverting amplifier 6 for oscillation. The internal construction of inverting amplifier 6 corresponds to that illustrated in FIG. 2, except that this inverting amplifier 6 is supplied with power supply voltage $V_d$.

On the other hand, buffering stage 2 is constituted by two serially connected N-channel MOS (N-MOS) FETs 11 and 12, resistor 14, and capacitor 15. Namely, the drain of N-MOS FET 11 is supplied with power supply voltage $V_d$ identical with that supplied to oscillating stage 1, and the source of N-MOS FET 11 is connected to the drain of N-MOS FET 12. The source of N-MOS FET 12 is connected to the ground potential. A signal delivered from the output terminal of inverting amplifier 6 of oscillating stage 1 is directly impressed to the gate of N-MOS FET 11 without intervention of any capacitor. Resistor 14 and capacitor 15 constitutes so-called CR time constant circuit which functions as delay circuit 13, and via such delay circuit 13, a signal appearing at the input terminal of inverting amplifier 6 of oscillating stage 1 is impressed to the gate of N-MOS FET 12. Output signal $V_o$ of the crystal oscillator is obtained from a connecting point where the source of N-MOS FET 11 and the drain of N-MOS FET 12 are connected together. As described above, the output of oscillating stage 1 takes the form of a signal of rectangular wave, and the output signal of inverting amplifier 6 for oscillation is a reverse signal against non-reverse signal at the input side thereof. Therefore, the reverse signal appearing at the output of inverting amplifier 6 is impressed to the gate of N-MOS FET 11, and the non-reverse signal appearing at the input of inverting amplifier 6 is impressed to the gate of N-MOS FET 12. The delay time set by delay circuit 13 is predetermined so as to be identical with the delay time between the input and output of inverting amplifier 6.

The operation of this circuit will be described hereinbelow.

The operation of oscillating stage 1 is similar to that of the conventional crystal oscillator, and a rectangular wave signal of which the amplitude corresponds to power supply voltage $V_d$ is outputted from inverting amplifier 6 for oscillation as an oscillating output. Thus, the two stepped voltage levels in this rectangular wave signal will be hereinbelow called a high level and a low level.

When a high level signal is impressed from the output of inverting amplifier 6 to the gate of N-MOS FET 11, the input of inverting amplifier 6 is kept at low level, and the low level signal is impressed to the gate of N-MOS FET 12. Hereby, N-MOS FET 11 is placed in ON condition, and N-MOS FET 12 is placed in OFF condition. Therefore, between the drain and source of N-MOS FET 11, there appears a drain current from power supply $V_d$ toward output $V_o$. At this stage, concerning the relationship between a gate-to-source voltage of N-MOS FET 11 and the drain current, there exists a so-called threshold voltage VT before the start of flow of the drain current. Therefore, a voltage at the connecting point of N-MOS FET 11 and N-MOS FET 12, i.e., output voltage $V_o$ corresponds to a voltage obtained by subtracting threshold voltage VT from power supply voltage $V_d$.

On the other hand, when a low level signal is impressed from the output of inverting amplifier 6 to the gate of N-MOS FET 11, a high level signal is impressed from the input of inverting amplifier 6 to the gate of N-MOS FET 12. Hereby, N-MOS FET 11 is placed in OFF condition, while N-MOS FET 12 is placed in ON condition to thereby establish an electric conduction between the drain and the source of N-MOS FET 12. Thus, the electric potential of output $V_o$ becomes ground potential.

From the above-described operation, it will be understood that output signal $V_o$ from the connecting point of N-MOS FETs 11 and 12 becomes a rectangular wave signal similar to the output of oscillating stage 1, and the amplitude of such output signal corresponds to a value obtained by subtracting the threshold voltage $V_T$ of N-MOS FET 11 from power supply voltage $V_d$. Accordingly, if the power supply of buffering stage 2 is made common with that of oscillating stage 1, the amplitude level of the output signal can be restricted to a small value, and thus the power consumption of the external circuits connected to this crystal oscillator can be controlled to a reduced amount. Also, the amplitude level of output signal $V_o$ may be set at any desired value by adjustably changing threshold voltage $V_T$ of N-MOS FET 11 even if power supply voltage $V_d$ is kept constant.

According to the crystal oscillator of the present embodiment, when it is formed in an IC chip, it is not necessary to incorporate into the IC chip, two power supply circuits in total for oscillating and buffering stages 1 and 2, and therefore the size of the IC chip can be made small. Further, differing from the conventional circuit, the buffering stage does not need to employ any inverting amplifier having a feedback resistor. Thus, a noise source may be removed so as to improve the phase noise characteristic of the output signal.

In the constitution of this circuit, a signal is impressed from the input of inverting amplifier 6 for oscillation to the gate of N-MOS FET 12 via delay circuit 13. In inverting amplifier 6, although a timing of change in the signal level at the input thereof and another timing of change in the signal level at the output thereof are shifted from one another by an amount corresponding to a delay time peculiar to inverting amplifier 6, in the circuit of the present embodiment, according to provision of delay circuit 13, the above-mentioned shifting of the timings can be compensated for. Thus, a continuous rectangular wave output signal at a high accuracy can be obtained.

In the described embodiment, delay circuit 13 is formed by a CR time constant circuit constituted by resistor 14 and capacitor 15. However, delay circuit 13 may be formed by a delay line and so on instead of the CR time constant circuit. Nevertheless, from the viewpoint of forming the crystal oscillator as an IC chip, an employment of the time constant circuit is advantageous. When there is not any particular problem in appearance of a phase difference between the input and output of inverting amplifier 6, provision of delay circuit 13 is not necessary.

In the above-described crystal oscillator, buffering stage 2 is constituted by serially connecting two N-MOS FETs. However, buffering stage 2 may be constituted by serially connected two P-MOS FETs. In that case, power supply $V_d$ should be a negative power supply. In conclusion, the buffering stage should be constituted by serially connecting two MOS FETs of the same conductive type, and the power supply should be selected and set according to the employed conductive type.

What is claimed is:

1. A crystal oscillator comprising:

an oscillating stage which has a resonance circuit including a crystal unit and a capacitor, an inverting amplifier, and a feedback resistor connected to said inverting amplifier, said inverting amplifier feeding back and amplifying a resonance frequency component of said resonance circuit to output the resonance frequency component; and a buffering stage for outputting an output of said oscillating stage after reducing an amplitude thereof, said buffering stage including first and second MOS FETs of same conductive type arranged in series between an electric power supply and a reference potential, wherein a signal at an output terminal of said inverting amplifier is impressed to a gate of said first MOS FET, a signal at an input terminal of said inverting amplifier is impressed to a gate of said second MOS FET, and an output is obtained from a connecting point of said first and second MOS FETs.

2. The crystal oscillator according to claim 1, wherein said inverting amplifier comprises a CMOS inverting amplifier electrically driven by said electric power supply.

3. The crystal oscillator according to claim 1, wherein said reference potential is ground potential.

4. The crystal oscillator according to claim 3, wherein said electric power supply has positive potential with respect to said ground potential, and said first and second MOS FETs comprise N-channel MOS FETs.

5. The crystal oscillator according to claim 1, wherein a delay circuit is interposed between said input terminal of said inverting amplifier and said gate of said second MOS FET.

6. The crystal oscillator according to claim 5, wherein said delay circuit comprises a CR time constant circuit including a resistor and a capacitor.

7. The crystal oscillator according to claim 1, wherein said first MOS FET is disposed a the side of said electric power supply, and said second MOS FET is disposed on a side of said reference potential.

* * * * *